United States Patent
Kumada

(10) Patent No.: US 9,748,370 B2
(45) Date of Patent: Aug. 29, 2017

(54) TRENCH MOS SEMICONDUCTOR DEVICE

(71) Applicant: FUJI ELECTRIC CO., LTD., Kawasaki-shi (JP)

(72) Inventor: Keishirou Kumada, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 36 days.

(21) Appl. No.: 14/622,822

(22) Filed: Feb. 13, 2015

(65) Prior Publication Data
US 2015/0270387 A1 Sep. 24, 2015

(30) Foreign Application Priority Data
Mar. 19, 2014 (JP) .................... 2014-055728

(51) Int. Cl.
*H01L 29/78* (2006.01)
*H01L 29/739* (2006.01)
H01L 29/06 (2006.01)
H01L 29/40 (2006.01)

(52) U.S. Cl.
CPC ...... *H01L 29/7397* (2013.01); *H01L 29/0619* (2013.01); *H01L 29/0696* (2013.01); *H01L 29/402* (2013.01)

(58) Field of Classification Search
CPC ............. H01L 29/7397; H01L 29/0638; H01L 29/0696
See application file for complete search history.

(56) References Cited

U.S. PATENT DOCUMENTS

| 5,557,128 A * | 9/1996 | Yamazaki ........... H01L 27/0248 257/341 |
| 5,729,032 A | 3/1998 | Tomomatsu et al. |
| 2001/0054738 A1 | 12/2001 | Momota et al. |
| 2006/0163649 A1 | 7/2006 | Otsuki |
| 2012/0112241 A1* | 5/2012 | Matsushita ......... H01L 29/7397 257/139 |
| 2013/0037853 A1* | 2/2013 | Onozawa ............ H01L 29/0661 257/139 |
| 2015/0263144 A1* | 9/2015 | Misu ..................... H01L 29/407 257/139 |

FOREIGN PATENT DOCUMENTS

| JP | H08-8422 A | 1/1996 |
| JP | 2001-308327 A | 11/2001 |
| JP | 3361874 B2 | 1/2003 |
| JP | 2007-221012 A | 8/2007 |
| JP | 4857566 B2 | 1/2012 |
| JP | 2012-119658 A | 6/2012 |
| WO | WO-2011/111500 A1 | 9/2011 |

* cited by examiner

Primary Examiner — Jerome Jackson, Jr.
(74) Attorney, Agent, or Firm — Rabin & Berdo, P.C.

(57) ABSTRACT

To prevent a malfunction of an overcurrent protection circuit without increasing an on-voltage, and to suppress a short circuit capacity, thus further reducing a switching loss, a trench gate IGBT is provided in which is incorporated a sense IGBT connected in parallel to a main IGBT, where only the sense IGBT portion includes a p-type channel region all over in a semiconductor substrate between adjacent parallel striped trenches, so that the capacitance of the MOS gate of the sense IGBT is smaller than the capacitance of the MOS gate of the main IGBT.

10 Claims, 14 Drawing Sheets

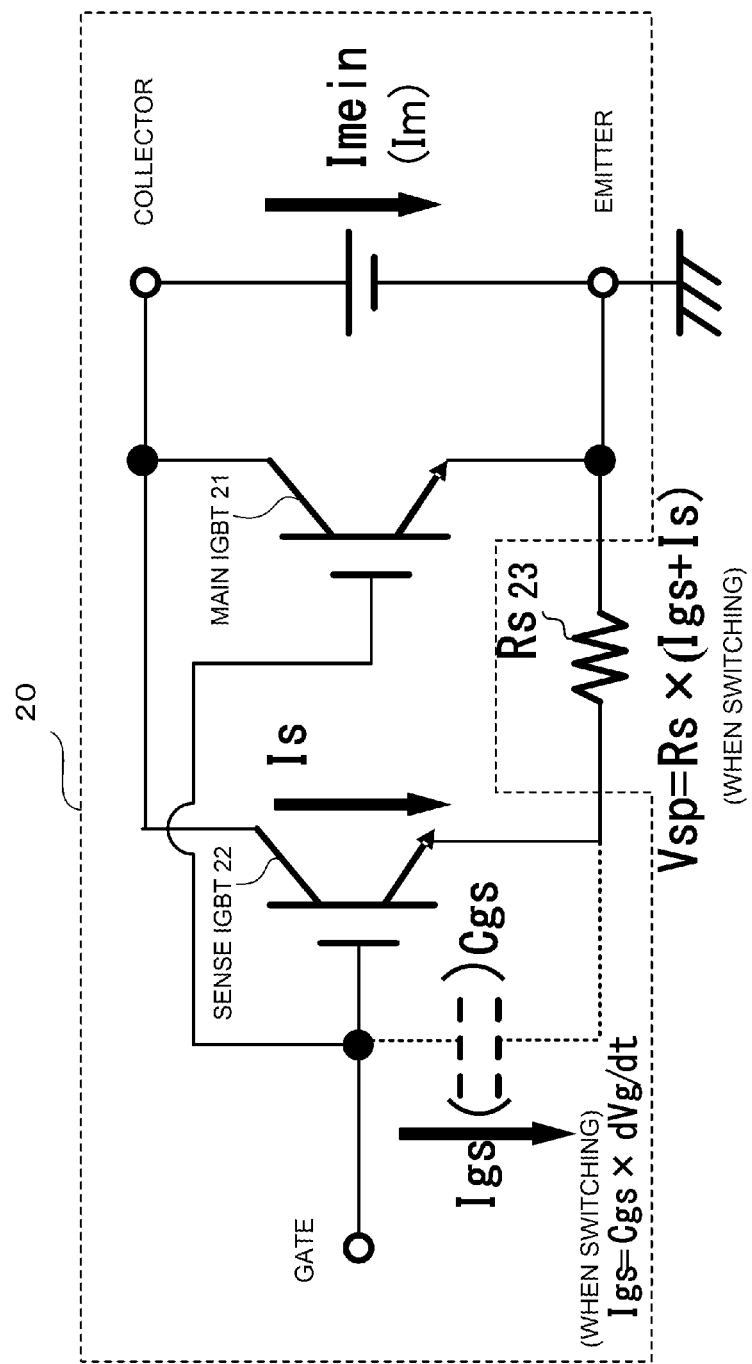

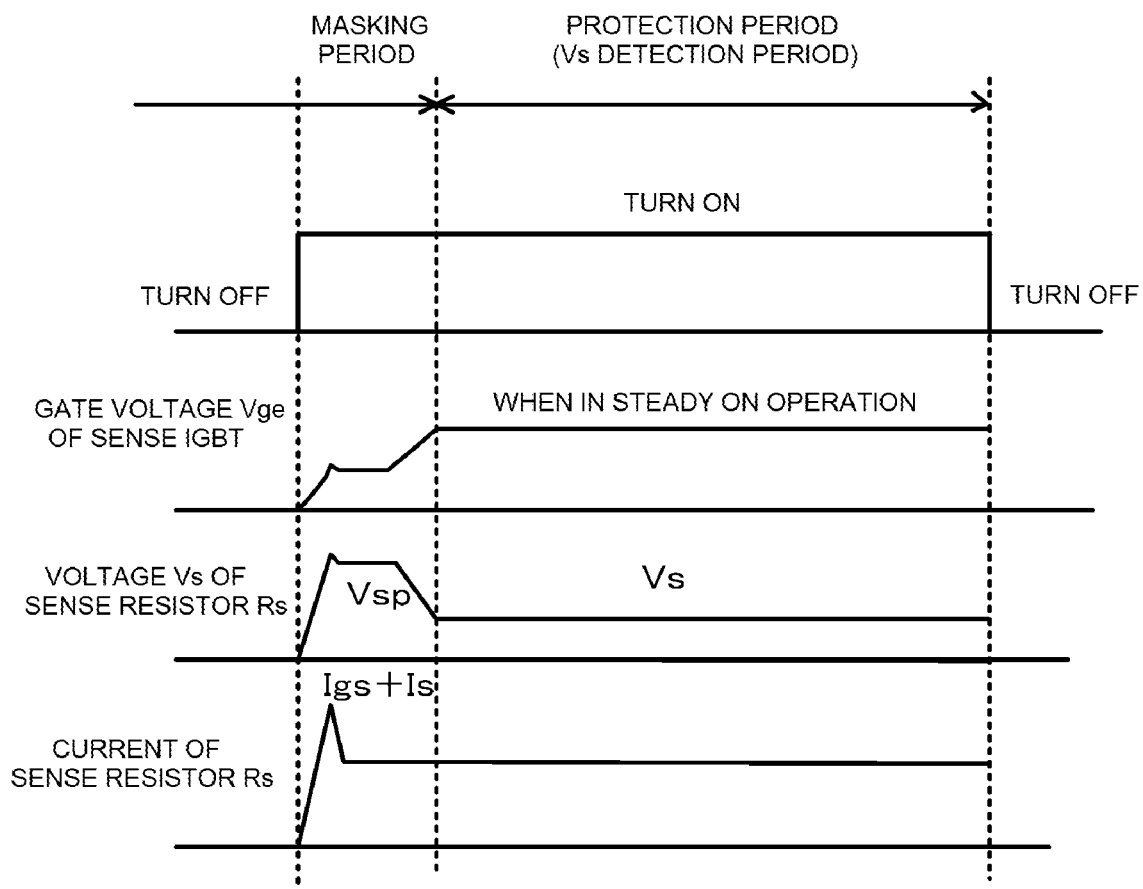

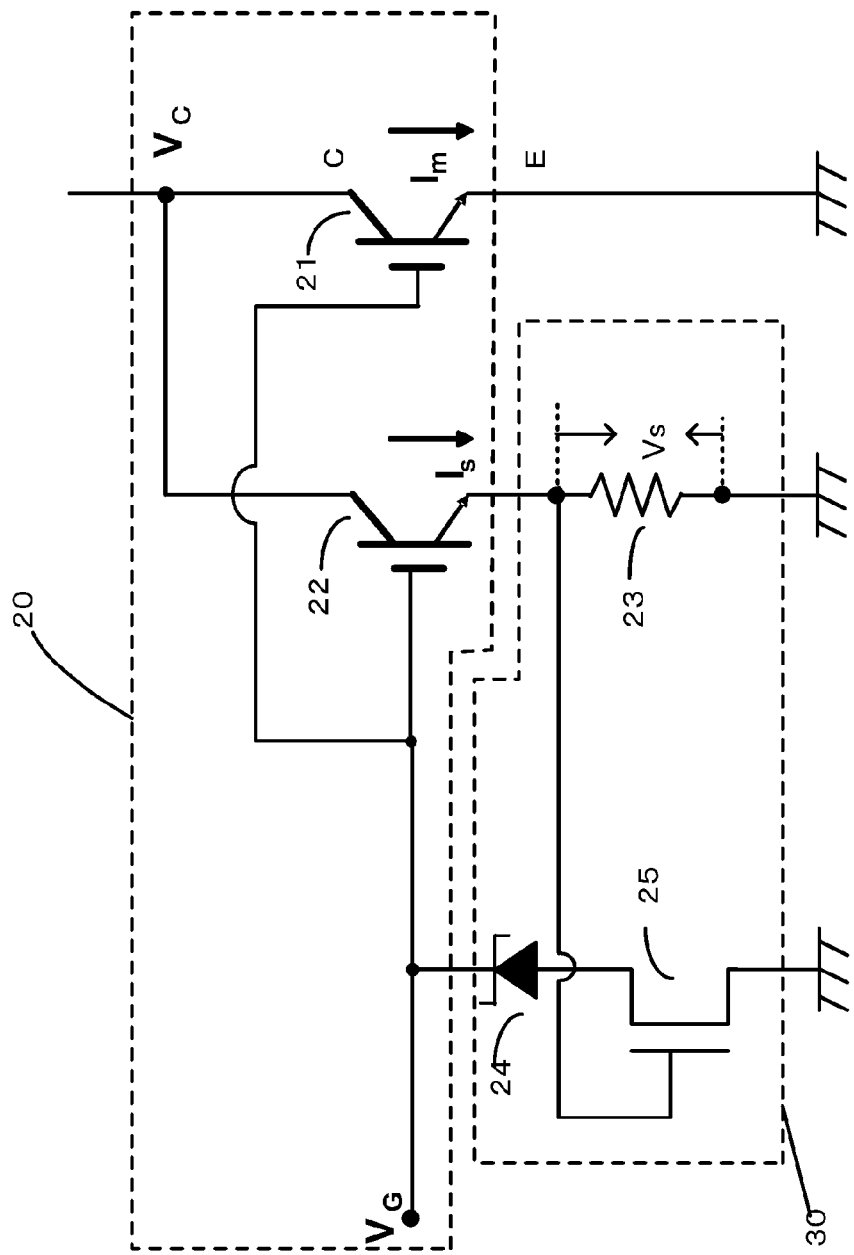

TRENCH MOS SEMICONDUCTOR DEVICE

CROSS-REFERENCE TO RELATED APPLICATIONS

This application claims priority from Japanese Patent Application JP 2014-055728, filed on Mar. 19, 2014, hereby incorporated by reference.

BACKGROUND OF THE INVENTION

1. Field of the Invention

The present invention relates to a trench MOS semiconductor device mounted on a power conversion device such as an inverter.

2. Description of the Background Art

A power MOS semiconductor device includes main electrodes provided one on each surface in order to cause a main current to flow in a vertical direction (a thickness direction) of a semiconductor substrate and a gate electrode for on/off controlling the main current on one surface side. An insulated gate bipolar transistor (hereafter abbreviated to an IGBT) or a MOS field effect transistor (MOSFET) is a typical device thereof. A power MOS semiconductor device such as the IGBT has a unit cell aggregate structure in which a large number of unit cells each including the layer configuration of the IGBT in the semiconductor substrate are connected in parallel by the main electrodes on the two surfaces.

An inverter device on which this kind of IGBT is mounted includes, in case of an occurrence of a short circuit, a protection function which immediately detects an overcurrent due to the short circuit and interrupts power, but apart from this, as shown in FIG. 9, an IGBT 20 itself also has a function which, when an overcurrent is detected by an overcurrent protection circuit 30 incorporated therein as an external circuit, suppresses or interrupts a current, thus protecting the IGBT.

An IGBT combined with this kind of overcurrent protection circuit may incorporate a sense IGBT connected in parallel with a main IGBT. A trench gate IGBT in which, by making the gate threshold voltage of the sense IGBT higher than the gate threshold voltage of the main IGBT, the main IGBT is turned on later than the sense IGBT, thus protecting the main IGBT against an overcurrent, is known (Japanese Patent No. 3,361,874; Paragraphs [0031], [0032], and the like).

It is described that detection accuracy is increased by reducing the mutual interference between a main cell and a sense cell. The description that a malfunction of a protection circuit is prevented by reducing the gate capacitance of a sense cell portion and reducing a spike voltage generated in a current detection resistor (a sense resistor) when turning on, is disclosed (JP-A-8-8422; Abstract and Paragraphs [0019] and the like).

A trench MOS semiconductor device wherein it is possible to improve an interruptible current by suppressing a rise in on-voltage without deteriorating fast switching characteristics, is disclosed (JP-A-2007-221012; Paragraphs [0015] and the like).

A problem resulting from the difference of the sense current ratio between a sense IGBT and a main IGBT when switching, from the current ratio when in steady operation, when detecting a current (a sense current) flowing through the sense IGBT by measuring a voltage of the sense resistor, is described. There is also the description of the relationship with a feedback capacitance (JP-A-2012-119658; Paragraphs [0002], [0005], and the like). There is the description of an IGBT wherein when a voltage applied between the collector and the emitter is low, a Miller capacitance (a feedback capacitance) is reduced by connecting polysilicon in parallel trenches, which sandwich a floating region, to the emitter electrode. There is also the description that by p-type channel regions sandwiched between the parallel trenches being laid out in a staggered fashion like in a checkered pattern in order to adopt a non-floating structure, it is possible to dispose the p-type channel regions in a uniform dispersion, and a uniform field distribution too, thus protecting a reduction in element dielectric strength, and furthermore, that it is possible to reduce the Miller capacitance by narrowing the space between the parallel trenches (WO2011/111500A1; Paragraphs [0008], [0010 to 0015], and the like) (Japanese Patent No. 4,857,566; Paragraph [0013]).

Furthermore, in order to further reduce the on-voltage of the IGBT, there is an IEGT (Injection Enhanced Gate Transistor). The IEGT is an IGBT including a trench MOS gate structure having the IE effect (Injection Enhancement effect) of reducing the on-voltage by increasing the density of accumulation of holes on the emitter side of a drift layer (for example, JP-A-2001-308327). As a specific example of the IEGT, there is a trench gate IGBT of a structure in which a floating region 102-2, which is separated from an emitter electrode 107 by an insulating film 108 and electrically insulated by trenches 104 in a direction parallel to a main surface, and through which no main current flows, is provided in order to produce the IE effect, as shown in, for example, FIG. 10. The IEGT 300 also includes p-type channel regions 102-1, emitter regions 103, a gate insulating film 105 and a gate electrode 106. This IEGT 300 is known as being of a structure for further reducing the on-voltage of the trench gate IGBT.

Also, in the IEGT 300 of FIG. 10, as it has the electrically insulated floating region 102-2 in a potentially floating condition, injected carriers (holes) are likely to be accumulated in a drift layer 101 when turning on, thus reducing the on-voltage, but on the other hand, the capacitance between a gate electrode 110 and a collector electrode 109 increases, thus increasing a switching loss. In this way, in the IEGT 300, the on-voltage and the switching loss are in a trade-off relationship. Moreover, when the floating region 102-2 is provided, field concentration in the bottom portions of the trenches 104 is liable to increase, meaning that there is also the problem of it being difficult to increase a dielectric strength.

As previously described in Japanese Patent No. 3,361,874, JP-A-2007-221012, JP-A-2012-119658, WO2011/111500A1, Japanese Patent No. 4,857,566, and JP-A-2001-308327, in the trench gate IGBT, it is possible to increase the channel density, and thus possible to reduce the on-voltage, compared with in a planar gate IGBT, but as a result of the increase in the channel density, the gate capacitance also increases. When the gate capacitance increases, there arises the problem that the time required for charging and discharging is lengthened, thus increasing the switching loss.

FIG. 7 shows an equivalent circuit diagram wherein the overcurrent protection circuit 30 is removed from the equivalent circuit shown in FIG. 9 and a sense resistor Rs 23 is added to an equivalent circuit of the IGBT 20. In FIG. 7, when a main IGBT 21 and a sense IGBT 22, connected in parallel, are turned on, a low sense current Isense (Is) corresponding to the area ratio of the sense IGBT 22 of a small area to the main IGBT 21 of a large area flows through the sense IGBT 22 when the IGBT 20 is in steady on operation. Furthermore, when turning on, in addition to the sense current (Is), a displacement current Igs (=(Cge+Cgc)×dVg/dt) flowing transiently through a sense resistor Rs 23 flows through the sense IGBT 22 via a gate capacitance (Cge) between the gate electrode and emitter electrode of the sense IGBT 22 and a capacitance (Cgc) between the gate electrode and collector electrode. As a result of this, when switching, a voltage Vsp=Rs×(Igs+Is) higher than when in the steady on operation is generated in the sense resistor Rs 23.

This condition is shown in FIG. 8A which is a waveform diagram of the voltage and current generated in the gate electrode and sense resistor. Even though the displacement current Igs flowing through the sense resistor Rs is not a current proportional to a main current flowing between the collector and emitter of the main IGBT, there is a case in which the voltage Vsp generated in the sense resistor Rs by the displacement current Igs becomes too high to ignore. Because of this, it may happen that the voltage Vsp exceeds a voltage detection level which causes short circuit protection to operate. As a result of this, it is likely that this excess is erroneously detected as an overcurrent, thus interrupting the IGBT although a short circuit current is not flowing.

To respond to this problem, the period, in which the voltage Vsp is transiently generated in the sense resistor by the displacement current Igs when turning on, has heretofore been made a masking period in which the overcurrent protection circuit is not caused to operate. As a result of this, there is the possibility of a short circuit current flowing through the IGBT in the masking period and in a period from sending an off signal to the gate after a subsequent overcurrent detection until the IGBT is interrupted, meaning that it is necessary to cause the IGBT to secure the short circuit capacity of a size such that the IGBT does not break down in the periods. However, the IGBT which has secured the short circuit capacity of this kind of size has the problem that the on-voltage increases, thus increasing the switching loss.

SUMMARY OF THE INVENTION

The invention, having being contrived bearing in mind the heretofore described points, has for its object to provide a trench MOS semiconductor device wherein it is possible to prevent a malfunction of an overcurrent protection circuit without increase an on-voltage, and to suppress a short circuit capacity, and thus possible to further reduce a switching loss.

The invention, in order to solve the previously described problems and achieve the object of the invention, is a trench MOS semiconductor device including an identical first conductivity type semiconductor substrate; a main semiconductor element portion formed on the semiconductor substrate; and a current detection sense semiconductor element portion, connected in parallel to the main semiconductor element portion, which is relatively small in area ratio.

Each of the semiconductor element portions includes second conductivity type channel regions formed on one surface side of the semiconductor substrate; first conductivity type emitter regions provided in the front surface layers of the channel regions; trenches, having a parallel stripe pattern in plan view on the one surface side of the semiconductor substrate, which have a depth such that the trenches extend from the one surface of the semiconductor substrate, and after making contact with the emitter regions, reach a layer of the semiconductor substrate below the channel regions; conductors filling the trenches via insulating films; interlayer insulating films covering the conductors; and a MOS gate structure including a main electrode in common contact with the front surfaces of the channel regions and emitter regions.

The main semiconductor element portion is such that, in the front surface layers of the semiconductor substrate between the parallel striped trenches, a plurality of unit cells are laid out in a checkered pattern in plan view such that one unit cell alternates with another, with a front surface of the semiconductor substrate sandwiched therebetween, in a longitudinal direction between adjacent trenches, and that one unit cell is disposed diagonally to another adjacent unit cell, with the trench sandwiched therebetween, in a width direction of the trenches.

The current detection sense semiconductor element portion has a second conductivity type second channel region provided all over in the semiconductor substrate between adjacent parallel striped trenches, and has a structure in which one unit cell alternates with another with the second channel region sandwiched therebetween.

It is preferable that the trench MOS semiconductor device includes a structure in which the density of the unit cells of the sense semiconductor element portion is made higher than the density of the unit cells of the main semiconductor element portion.

It is preferred that the active region area ratio of the main semiconductor element portion to the sense semiconductor element portion is 100 to 10000:1.

It is desirable that the trench MOS semiconductor device includes a second conductivity type well region connected to an emitter electrode of the main semiconductor element portion; and a second conductivity type second well region connected to an emitter electrode of the sense semiconductor element portion, so as to surround the sense semiconductor element portion region.

It is preferable that the trench MOS semiconductor device includes a spaced portion wherein the main semiconductor element portion and the sense semiconductor element portion are spaced from each other, and that the semiconductor substrate is exposed to a portion of the spaced portion on the one surface side of the semiconductor substrate.

It is preferable that the length of the spaced portion is equal to or more than 25 μm and equal to or less than 30 μm.

As the trench MOS semiconductor device, an insulated gate bipolar transistor or a field effect transistor can be used.

By adopting the previously described configuration, the feedback capacitance of a sense IGBT decreases when an IGBT is turned on, meaning that the sense IGBT is turned on prior to a main IGBT. Also, structurally, as the area wherein a semiconductor substrate is in contact with a gate electrode via an oxide film is reduced, a p-type channel region is provided all over in the semiconductor substrate between adjacent parallel trenches in the sense IGBT portion alone. By adopting this kind of configuration, it is possible to reduce the feedback capacitance in the sense IGBT portion alone.

According to the invention, it is possible to provide a trench MOS semiconductor device wherein it is possible to prevent a malfunction of an overcurrent protection circuit without increase an on-voltage, and to suppress a short circuit capacity, and thus possible to further reduce a switching loss.

BRIEF DESCRIPTION OF THE DRAWINGS

FIG. 7 is an equivalent circuit diagram of the trench IGBT including the sense IGBT according to the first embodiment of the invention.

FIGS. 8A and 8B are charts, each showing a masking period including timings of a voltage and current of a sense resistor when turning on, according respectively to a heretofore known sense IGBT and the sense IGBT of the invention.

FIG. 9 is an equivalent circuit of the trench IGBT including an overcurrent protection circuit.

DETAILED DESCRIPTION OF THE INVENTION

Figure 1:
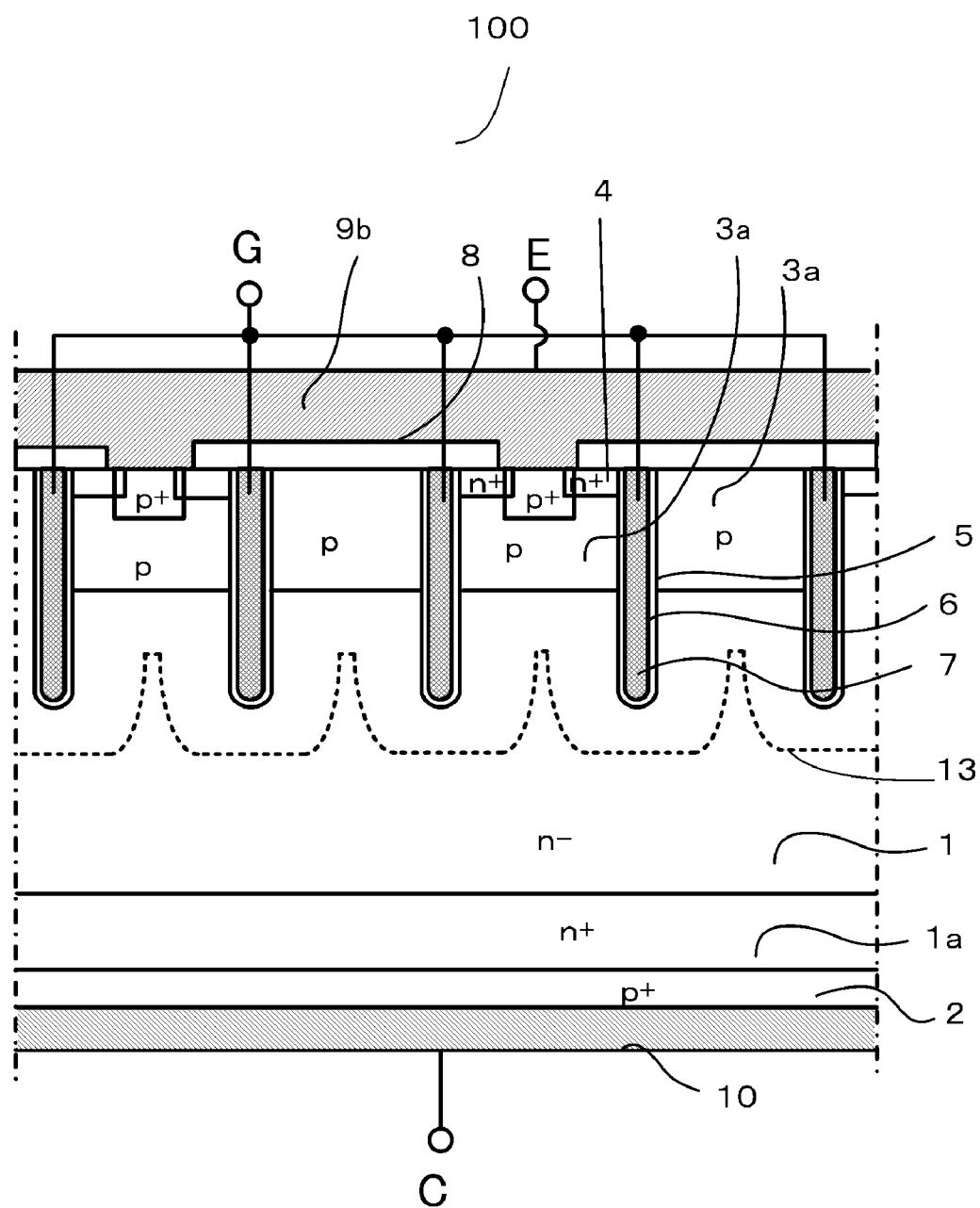
FIG. 1 is a main portion sectional view of an active region of a sense IGBT in a trench IGBT including the sense IGBT according a first embodiment of the invention.

Hereafter, a detailed description will be given, referring to the drawings, of embodiments relating to a trench MOS semiconductor device of the invention used in combination with an overcurrent protection circuit. In the present specification and the accompanying drawings, in layers and regions bearing n or p, n or p means that electrons or holes are majority carriers. Also, + or − affixed to n and p means that the impurity concentration is respectively relatively high or low. In the following description of the embodiments and the accompanying drawings, like components are given the same reference numerals and letters, thus omitting a redundant description. The accompanying drawings described in the embodiments are not illustrated on an exact scale or at an exact dimensional ratio for ease of visualization or comprehension. The invention is not limited to the following description of the embodiments without departing from the scope of the invention.

First Embodiment

FIG. 9 shows an equivalent circuit of an IGBT 20 according to the invention used in combination with an overcurrent protection circuit 30. The IGBT 20 in FIG. 9 is such that a main IGBT 21 and a current detection sense IGBT 22 connected in parallel to the main IGBT 21 are formed in an identical semiconductor substrate. A sense current Isense (Is) flowing through the sense IGBT 22 is a minute current corresponding to the area ratio of the active region of the sense IGBT 22 to the active region of the main IGBT 21, relative to a main current Imein (Im) flowing through the main IGBT 21. The term "the active region" here is a region, located in the central portion of a semiconductor substrate chip of the IGBT and surrounded by an edge region on the periphery of the chip, which secures the reliability of dielectric strength and through which the main current flows. Furthermore, when the main and sense IGBTs are turned on, in addition to the sense current Is, a displacement current (a charging current) Igs (Igs=(Cge+Cgc)×dVg/dt, where dVg/dt is a gate voltage rise rate) flowing transiently through a sense resistor 23 (Rs) flows through the sense IGBT 22 via a gate capacitance Cge and a capacitance (Cgc) between the gate electrode and the collector electrode.

When a short circuit current or overcurrent generated due to a load short circuit flows through the IGBT 20, a voltage Vs generated across a detection resistor for current detection (the sense resistor 23, Rs) configuring the overcurrent protection circuit 30 exceeds an appropriately set predetermined voltage value. Then, the voltage Vs becomes equal to or higher than the gate threshold voltage of a MOSFET 25, thus causing the MOSFET 25 to be conducting. By so doing, the voltage of the MOSFET 25 drops. Furthermore, a gate voltage $V_G$ is limited to equal to or lower than the gate threshold voltage of the IGBT by the zener voltage of a zener diode 24 connected in series to the MOSFET 25. By so doing, the overcurrent flowing through the main IGBT 21 is interrupted.

Normally, the size of the overcurrent is set to, for example, a current value on the order of two to three times greater than a rated current. Also, the active region area ratio of the main IGBT 21 to the sense IGBT 22 of the IGBT 20 combined with the overcurrent protection circuit 30 is, for example, several hundred to ten thousand:1. As the main and sense IGBTs 21 and 22 have this kind of active region area ratio, the voltage Vs is generated in the detection resistor (sense resistor 23, Rs) by the minute current flowing through the sense IGBT 22 far smaller than the main IGBT 21. By detecting the voltage Vs, it is possible to indirectly measure a current value flowing through the main IGBT 21, and cause an overcurrent protection function to operate in the way previously described, thus protecting the main IGBT.

Meanwhile, it is necessary for a power device, such as the IGBT, to secure a short circuit capacity higher than, at least, a level such that the power device does not break down for a time (for example, a time of 10 to 20 μsec) until the interruption by the protection circuit function finishes. Furthermore, general electric characteristics, such as low on-voltage and fast switching characteristics, are also required of the power device. However, in a trench gate IGBT or IEGT, the more the trench structure is increased in density in order to get a low on-voltage, the area configuring the gate-emitter capacitance increases, and the gate capacitance increases. The increase in the gate capacitance leads to an increase in switching loss.

Also, when attempting to further enhance the previously described IE effect, the area of a floating region 102-2 becomes relatively larger than the area of a trench MOS gate region 110. Then, the gate-emitter capacitance decreases, and the gate capacitance becomes almost equal to a gate-collector capacitance (a feedback capacitance or a Miller capacitance), thus resulting in an increase in turn-on loss. The reason is that as it is necessary, when switching the trench gate IGBT, to charge and discharge the gate-emitter and gate-collector capacitances, when the gate capacitance increases, the charge and discharge time increases, and the switching time increases. When a common trench gate IGBT is turned on, there is a relationship wherein the Miller capacitance has a Miller period in which along with the gate voltage being raised, firstly, the gate-emitter capacitance is charged, and next, the gate-collector capacitance (Miller capacitance) is charged.

Also, as the total generation loss of the power device is the sum of a steady loss determined by an on-voltage and a switching loss generated when in on/off operation, it is also important, in order to reduce the total generation loss, to reduce the switching loss as well as the on-voltage, that is, to reduce the gate capacitance too.

Figure 5:
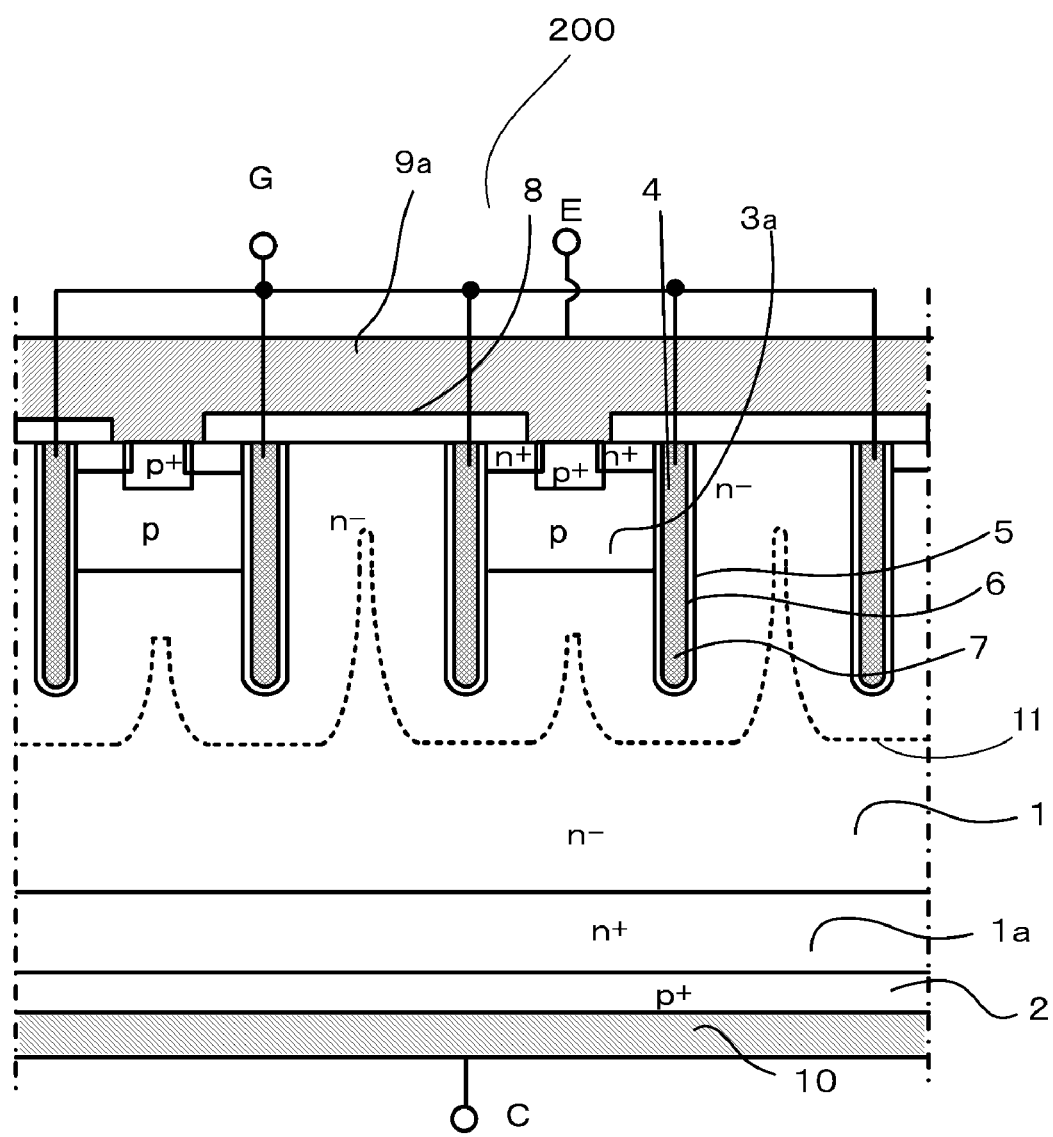
FIG. 5 is a main portion sectional view of an active region of a main IGBT in the trench IGBT including the sense IGBT according to the first embodiment of the invention.
Figure 6A:
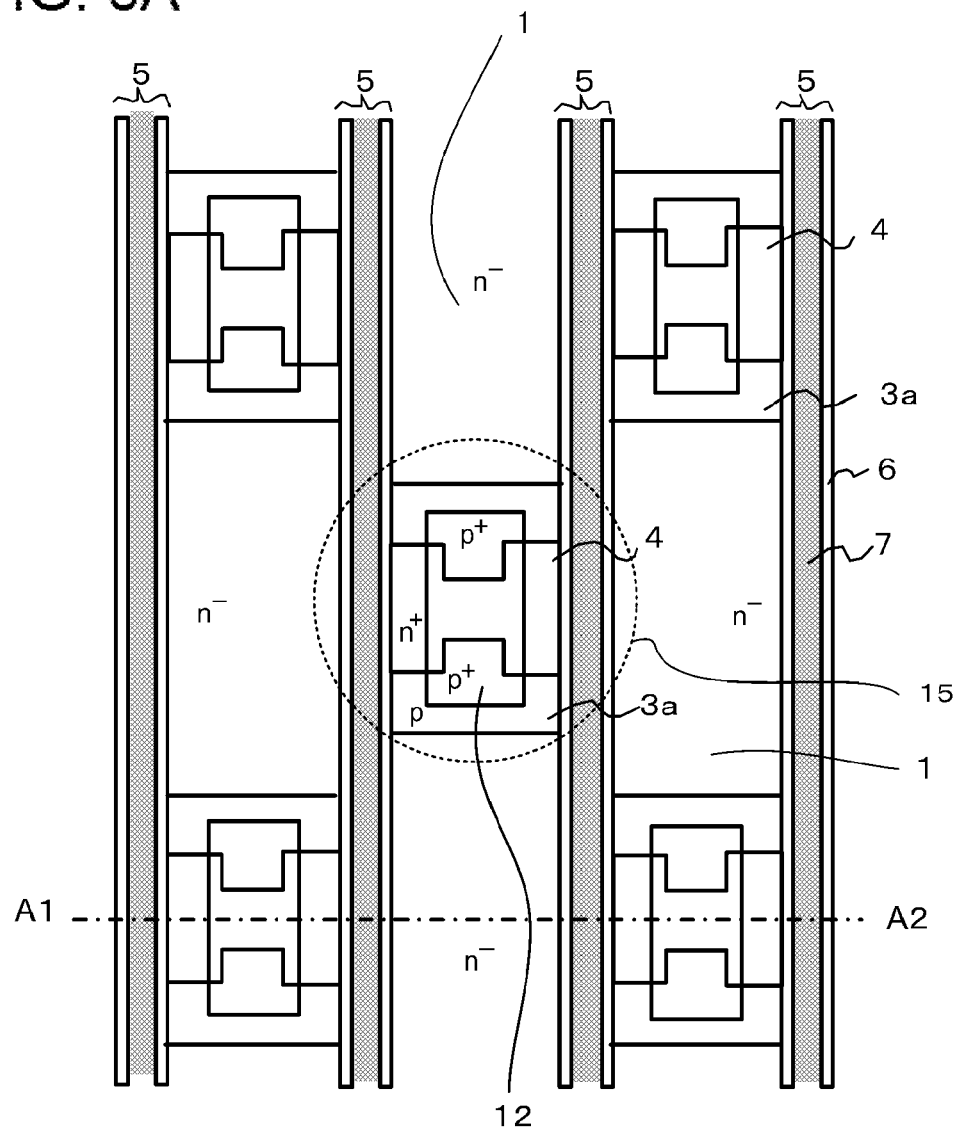
FIG. 6A is a main portion plan view of the active region of the main IGBT in the trench IGBT including the sense IGBT according to the first embodiment of the invention.
Figure 6B:
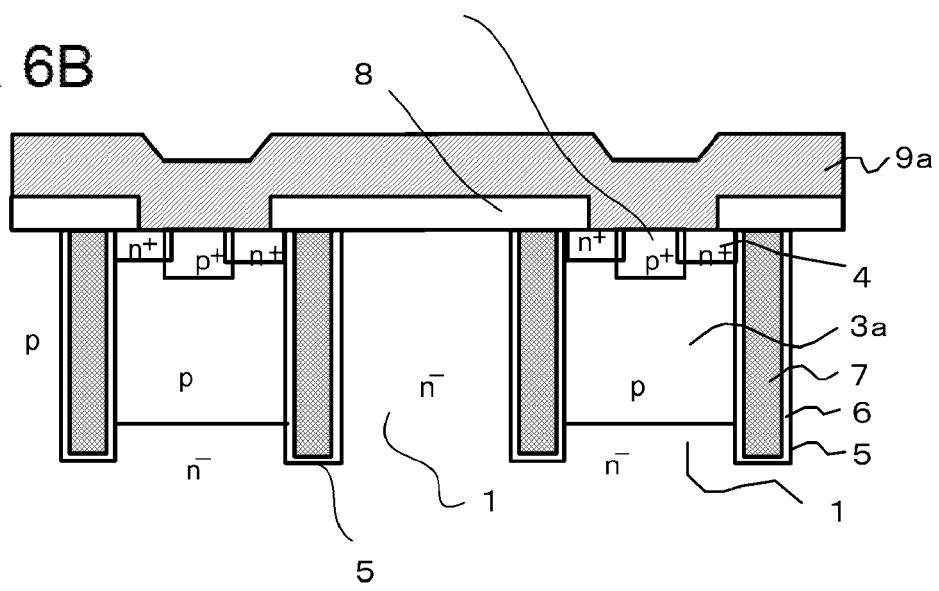
FIG. 6B is a sectional view along line A1-A2 of FIG. 6A.

Taking this problem into account, in a trench gate IGBT according to the invention, as the main IGBT 21, a trench gate IGBT 200 including island unit cells 15 in an active region, such as is shown in FIGS. 5, 6A, and 6B, which does not have the previously described floating region, is used. The trench gate IGBT 200 has parallel trenches 5, which have a stripe pattern in plan view, in the front surface of the active region through which the main current flows, as shown in the plan view of FIG. 6A. The trench gate IGBT 200 has a structure in which the unit cells 15 of the IGBT divided into islands are disposed so that one unit cell 15 alternates with another at predetermined intervals in a semiconductor substrate (an n⁻-type drift layer 1) sandwiched between adjacent parallel trenches 5. Moreover, as the whole of the active region, the unit cells 15 are laid out in a checkered pattern in plan view such that one unit cell 15 is disposed diagonally to another adjacent unit cell 15 with the parallel trench 15 sandwiched therebetween.

FIG. 6B is a sectional view along line A1-A2 of FIG. 6A. An emitter electrode 9a and an interlayer insulating film 8, described in FIG. 6B, are omitted in FIG. 6A. Also, in FIG. 6B, only the front surface side of the semiconductor substrate is described, and a collector layer or a collector electrode, formed on the rear surface side of the semiconductor substrate, are omitted. Between adjacent parallel trenches 5, the n⁻-type drift layer 1 exposed between adjacent unit cells 15 has immediately thereabove the interlayer insulating film 8 covering the front surface of the n⁻-type drift layer 1. Furthermore, in a direction along the parallel trenches 5, the front and rear of the n⁻-type drift layer 1 exposed between adjacent unit cells 15 are in abutment with respective p-type channel regions 3a of the adjacent unit cells 15. Because of this, the n⁻-type drift layer exposed between adjacent unit cells 15 does not form the kind of electrical floating region of the previously described IEGT. A feature obtained by this kind of structure is a configuration such as to allow the potential of the n⁻-type drift layer 1 exposed between adjacent unit cells 15 to be able to follow the p-type channel regions 3a. By so doing, it is possible to easily suppress and control a sharp current increase when the IGBT is turned on, which is due to a floating structure, with a gate resistor.

Figure 2:
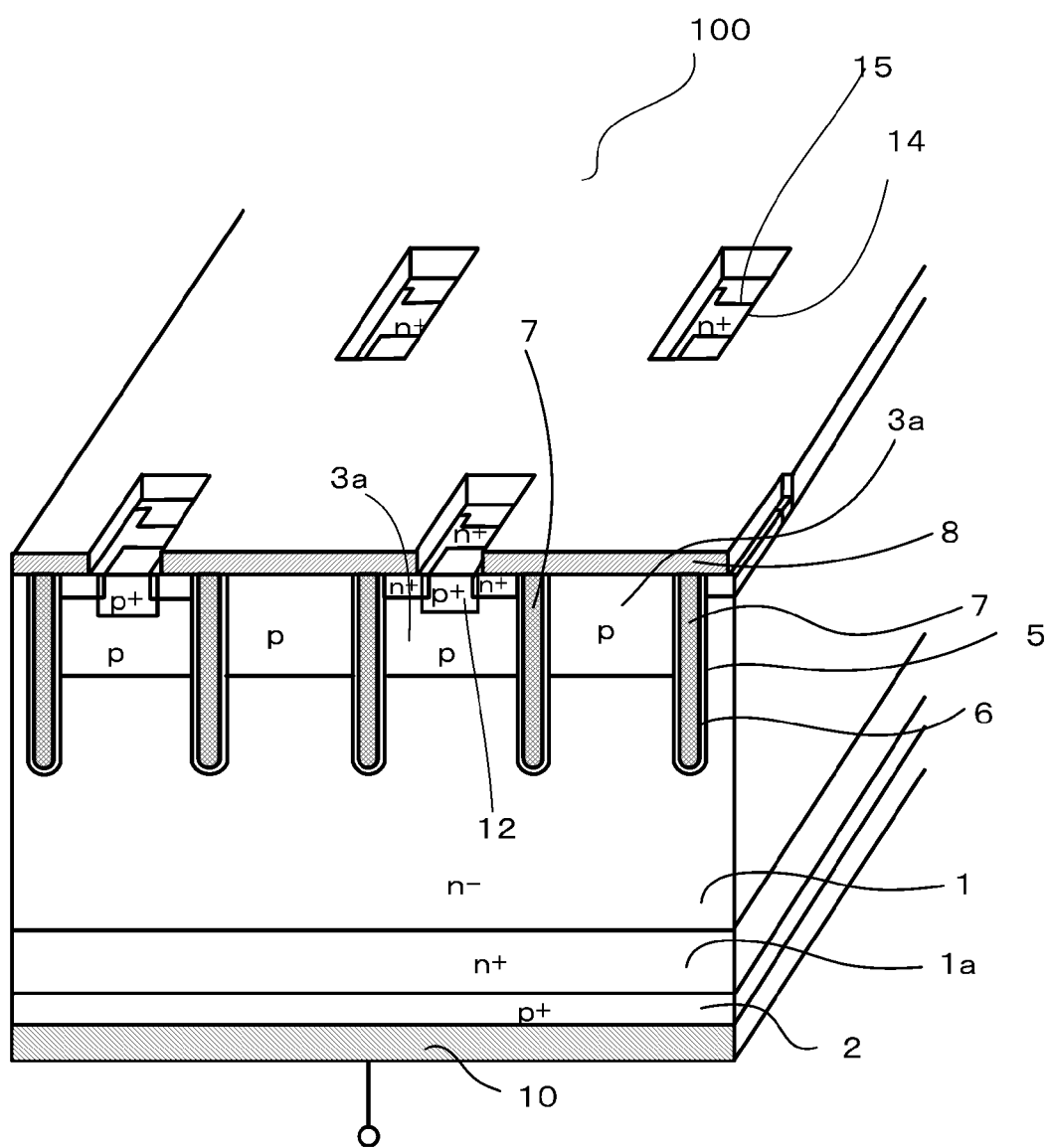
FIG. 2 is a main portion perspective sectional view of the active region of the sense IGBT in the trench IGBT including the sense IGBT according to the first embodiment of the invention.

Also, the n⁻-type drift layer 1 sandwiched between adjacent parallel trenches 5 is divided by a plurality of the p-type channel regions 3a. Further, as shown in FIG. 2, opening portions 14 are provided in portions of the interlayer insulating film only on the front surfaces of the unit cells 15 including the p-type channel region 3a closely sandwiched between the adjacent parallel trenches 5, thus providing the structure of bringing the unit cells 15 into contact with the emitter electrode. Because of this, it is possible to reduce the switching loss too while maintaining the on-voltage of the trench gate IGBT 200 low, thus reducing the total electrical loss generated in an actual device such as an inverter.

Figure 10:
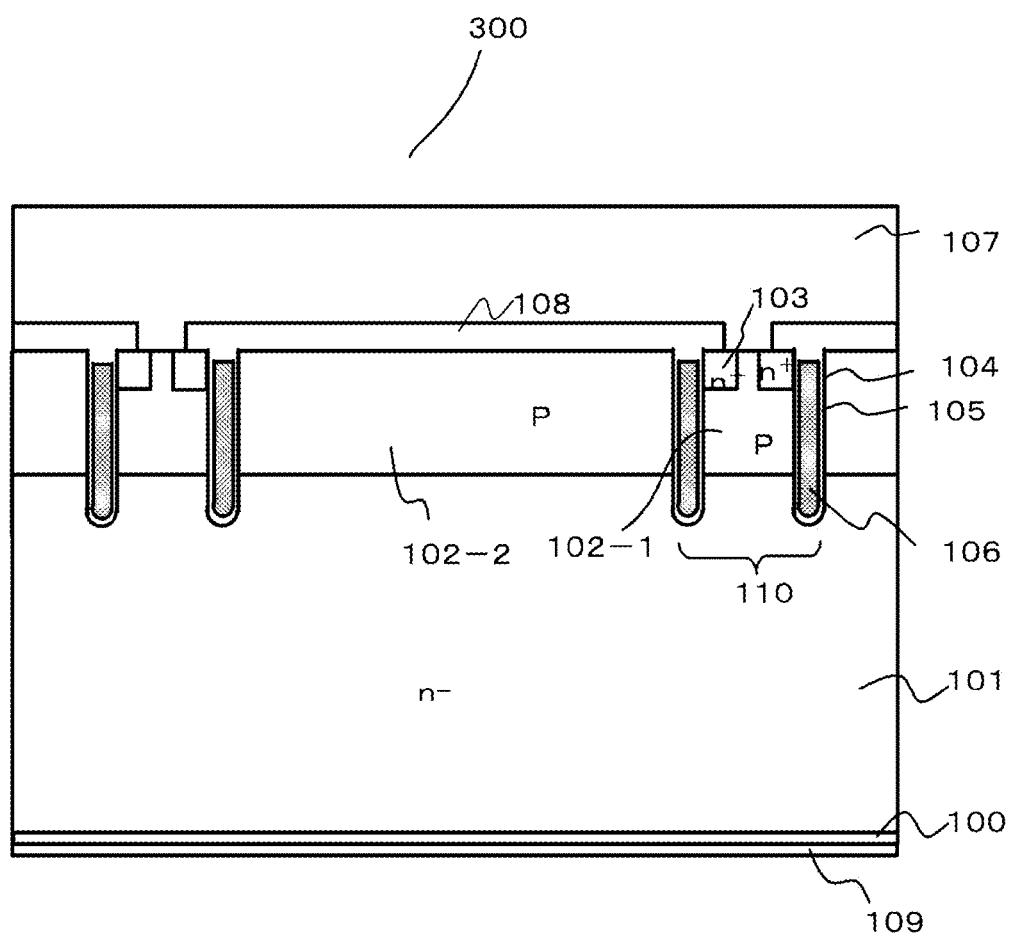
FIG. 10 is a main portion sectional view of a common IEGT.

Also, as the unit cells 15 are disposed in a uniform dispersion in the active region, the field distribution when in an off state also becomes uniform, and it is thus possible to prevent a decrease in dielectric strength compared with in an IEGT shown in FIG. 10. In addition, as a region wherein a gate electrode 7 faces an n⁺-type emitter region 4 is relatively small, it is possible to reduce the gate-emitter capacitance. Furthermore, by appropriately disposing the closely spaced trench gate structure, it is possible to relax a field concentration in a trench gate bottom portion, thus obtaining a high dielectric strength.

Also, by narrowing the width of the n⁻-type drift layer 1 sandwiched between adjacent parallel trenches 5, it is possible to easily deplete the n⁻-type drift layer 1 with an applied voltage of on the order of several volts. Because of this, it is possible not only to uniform the emitter side field dispersion in the drift layer in the off state, but to reduce the gate-collector capacitance (Miller capacitance).

When the p-type channel region 3a is provided all over in the sense IGBT, the IE (Injection Enhancement) effect decreases, and it is conceivable that the on-voltage may rise in the sense IGBT alone. However, as the area of the sense IGBT is only a few hundredths to a few thousandths as large as that of the main IGBT, there is no substantial effect on the sense IGBT.

Next, a description will be given of operations of the main IGBT and sense IGBT when turning on. FIG. 5 is a main portion sectional view of an active region of the main IGBT in a trench IGBT including the sense IGBT of the invention. When the collector-emitter voltage drops when turning on, an equipotential surface 11 at the leading end of the depletion layer of the main IGBT 21 is formed in a shape having irregularities each cut deeply in the n⁻-type drift layer 1 sandwiched between adjacent parallel trenches 5 and exposed between adjacent unit cells 15. The depth of the irregularities of the equipotential surface 11 becomes greater, as a result of which the area of the equipotential surface 11 increases. Because of this, the gate-collector capacitance Cgc increases. When the gate-collector capacitance Cgc increases, the charge and discharge time of the gate electrode increases, and the Millar period increases. Consequently, when the main IGBT and the sense IGBT have unit cells having the same surface pattern, as heretofore known, a current flowing through the sense resistor 23 (Rs) is superimposed as a charging current, and a voltage Vsp of the sense resistor increases as expressed by Vsp=Rs×(Igs+Is). Because of this, there arises the problem that the risk of a malfunction increases unless a masking period is provided. It is possible to prevent a malfunction by providing the masking period, but the problem is that the masking period becomes longer. However, the masking period is preferably shorter because it is a period in which the overcurrent protection function does not operate.

Therefore, an IGBT 50 (FIGS. 4A and 4B) according to the embodiment of the trench MOS semiconductor device of the invention combined with the overcurrent protection circuit adopts the following structure. FIG. 4A is a plan view of the whole of a chip of a trench IGBT including the sense IGBT according to the first embodiment of the invention, and FIG. 4B is an enlarged plan view of a sense IGBT portion shown by the dashed circle of FIG. 4A. That is, FIGS. 4A and 4B are plan views showing an example of the layout of the main IGBT 21 and sense IGBT 22 in the chip of the IGBT 50 according to the invention. As the main IGBT 21, the trench gate IGBT 200 shown in FIGS. 5, 6A, and 6B is used in the same way as previously described, but as the sense IGBT 22, an IGBT 100 shown in FIGS. 1 to 3A and 3B is used. By adopting this kind of configuration of the IGBT 50, the IGBT 50 is characterized in that the main IGBT and the sense IGBT are different in the surface pattern. The active region area ratio of the main IGBT 21 to the sense IGBT 22 is approximately several hundred to ten thousand: 1.

An IGBT 100 shown in FIG. 1 used as the sense IGBT 22 includes a highly concentrated p-type collector layer 2 and an n$^+$field stop layer 1a (FIG. 1) on one main surface (a lower side surface in FIG. 1) of an n$^-$-type drift layer 1 formed of an n-type semiconductor substrate with high resistivity. Furthermore, the IGBT 100 includes p-type channel regions 3a having n$^+$-type emitter regions 4 and p-type channel regions 3a having no n$^+$-type emitter regions 4 on the other main surface (an upper side surface in FIG. 1) of the n$^-$-type drift layer 1.

In the sense IGBT 22, the p-type channel regions 3a having the n$^+$-type emitter regions 4 and the p-type channel regions 3a having no n$^+$-type emitter regions 4 are regions which are collectively formed all over in the active region on the same formation conditions. The same formation conditions are that the p-type channel regions 3a are made equal to each other in p-type dopant ion-implantation dose amount and accelerating voltage, p-type dopant thermal diffusion temperature and time, or the like. The sense IGBT 22 is different in this respect from the main IGBT 21 having the structure of FIG. 5. Other layer structures of the sense IGBT 22 may be the same as those of the main IGBT. That is, in the layout in plan view shown in FIG. 3A, the n$^+$-type emitter regions 4 are formed in the front surface layer of the p-type channel region 3a provided all over between adjacent parallel trenches 5 of the sense IGBT 22. The layout in plan view of the n$^+$-type emitter regions 4 is the same as in the main IGBT.

Also, the parallel trenches 5 are formed to a depth such that the parallel trenches 5 pass through the p-type channel region 3a from the front surfaces of the n$^+$-type emitter regions 4 and reach the n$^-$-type drift layer 1. The inside of each parallel trench 5 is filled with a gate electrode 7 formed from conductive polysilicon via a gate insulating film 6. The gate electrodes 7 are connected to a gate pad (not shown) on the front surface of the chip by unshown gate wiring.

Figure 3A:
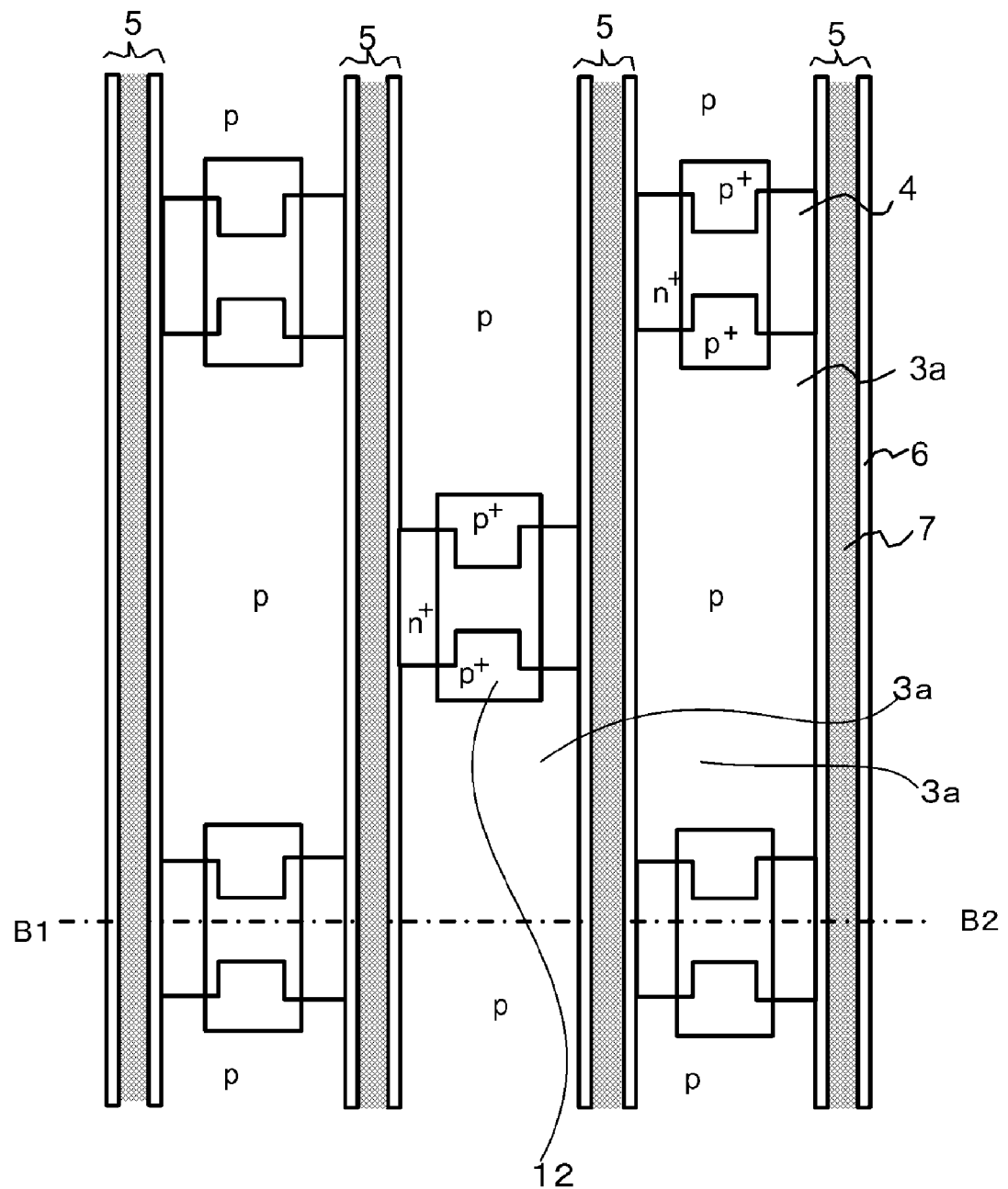
FIG. 3A is a main portion plan view of the active region of the sense IGBT in the trench IGBT including the sense IGBT according to the first embodiment of the invention.
Figure 3B:
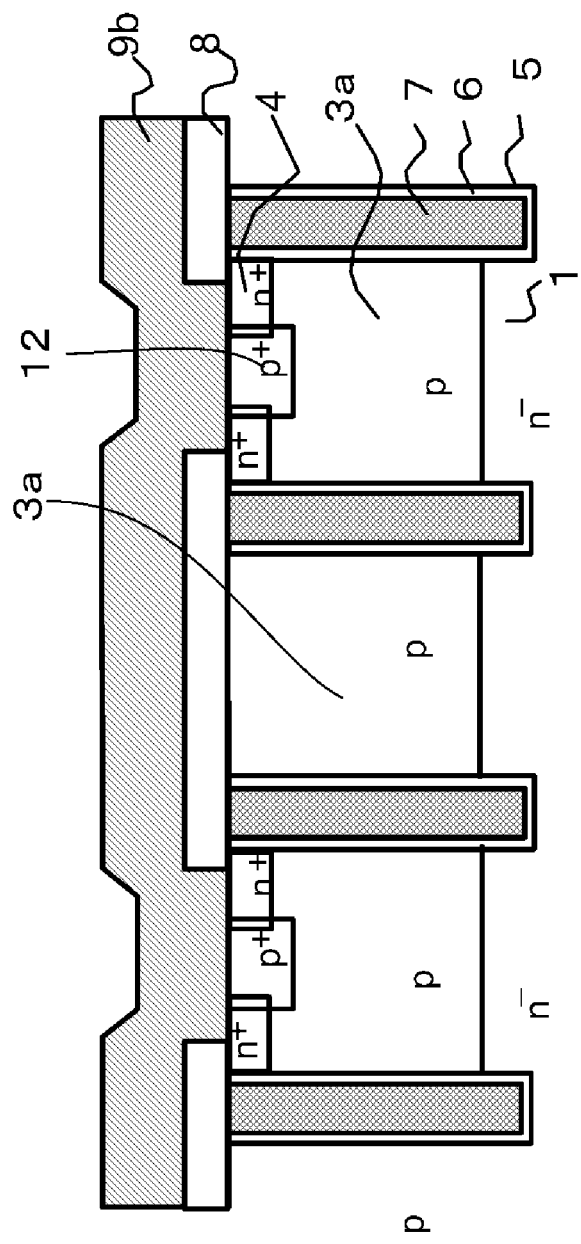
FIG. 3B is a sectional view along line B1-B2 of FIG. 3A.
Figure 4A:
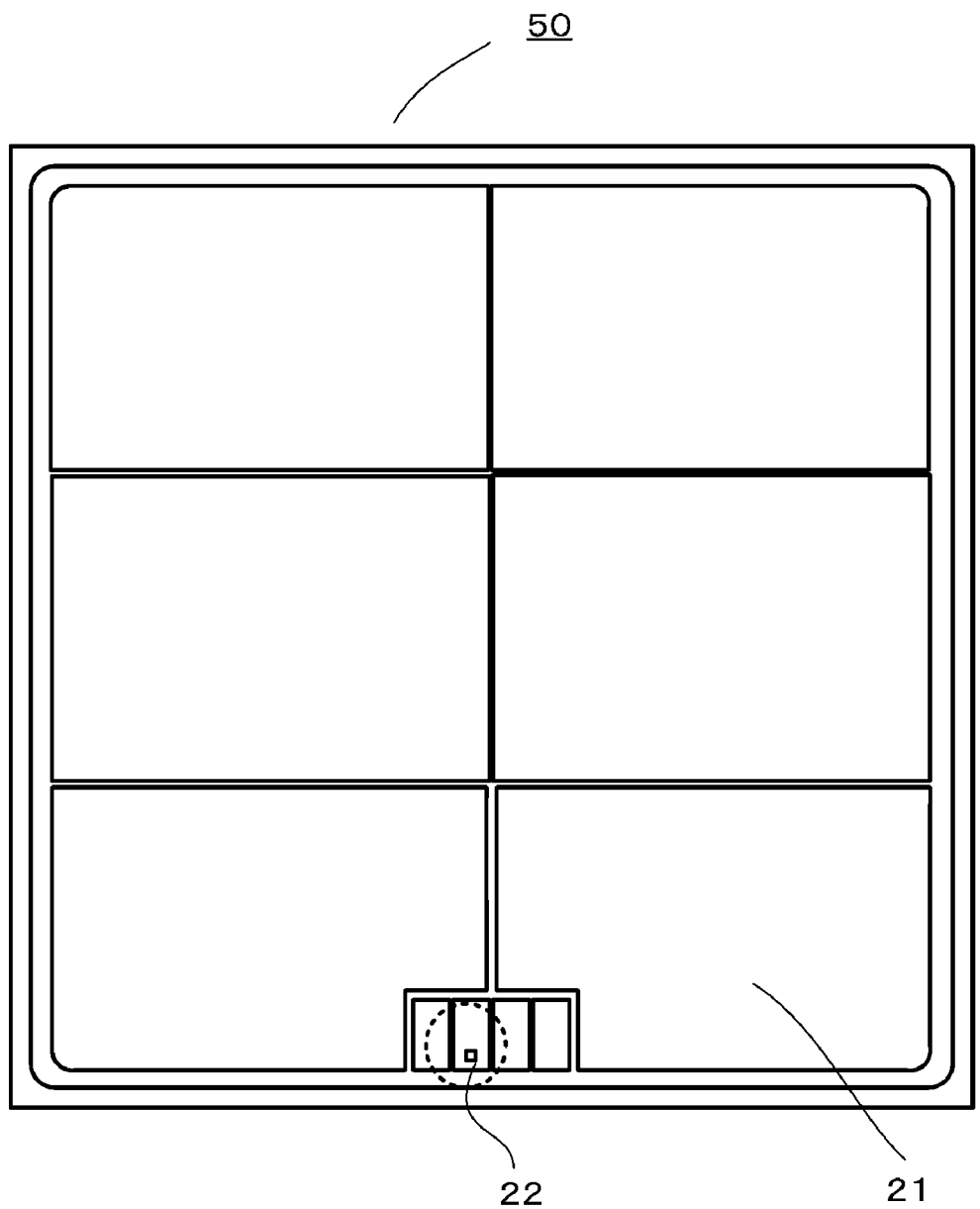
FIG. 4A is a plan view of the whole of a chip of the trench IGBT including the sense IGBT according to the first embodiment of the invention.
Figure 4B:
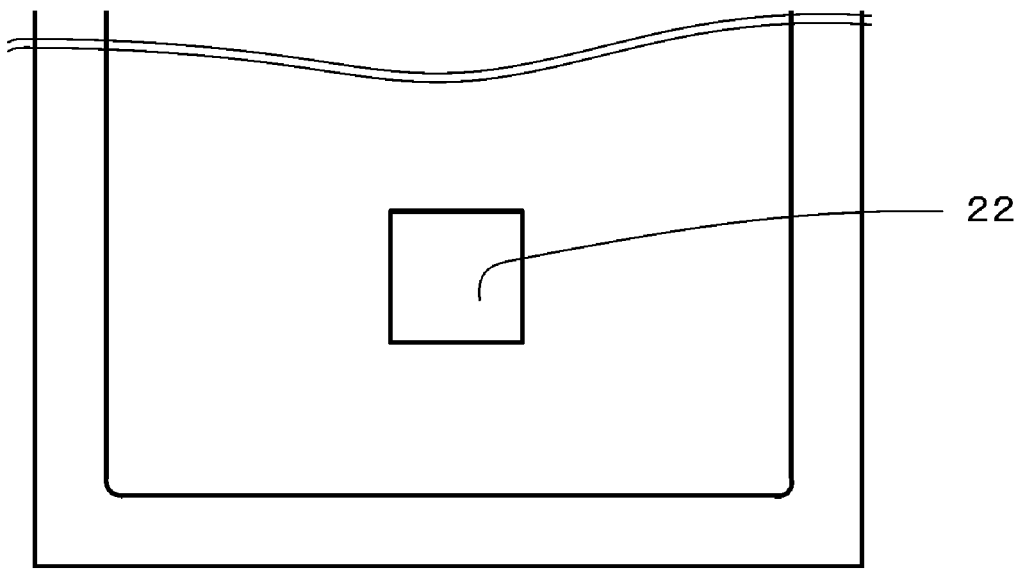
FIG. 4B is an enlarged plan view of a sense IGBT portion shown by the dashed circuit of FIG. 4A.

An interlayer insulating film 8 is formed immediately above the gate electrodes 7, as shown in FIG. 3B, thus securing the insulation from an emitter electrode 9b covering the top of the interlayer insulating film 8. Also, the emitter electrode 9b is in common contact with the front surfaces of the n$^+$-type emitter regions 4 and the front surfaces of the p-type channel regions 3a. It is preferable, however, that p$^+$contact regions 12 are provided in front surface portions of the p-type channel regions 3a wherein the emitter electrode 9b is in contact with the unit cells 15. Furthermore, a nitride film, an amorphous silicon film, a polyimide film, or the like, is formed as a passivation film on the top of the emitter electrode 9b, but is omitted in FIG. 3B. Also, a surface (a rear surface) on the p-type collector layer 2 side is covered with a collector electrode 10.

Next, a description will be given of operations, which are not described above, of the main IGBT and sense IGBT of the invention. The emitter electrode 9b of the sense IGBT 22 formed of the structure of the IGBT 100 shown in FIG. 1 is normally connected to ground. In a condition in which a voltage higher than that of the emitter electrode 9b is applied to the collector electrode 10, a voltage higher than a threshold value is applied between the gate electrodes 7 and the emitter electrode 9b, via a gate resistor, from a gate drive circuit (not shown). Then, the sense IGBT 22 attains an on state, and attains an off state at a voltage lower than the threshold value. When a voltage higher than the threshold value is applied to the gate electrodes 7 of the IGBT 100 in this way, firstly, electric charge starts to be accumulated in the gate electrodes 7. At the same time as the accumulation of electric charge in the gate electrodes 7, portions of the p-type channel regions 3a which face the gate electrodes 7 via the gate insulating films 6 are inverted to an n type, thus forming channel portions (not shown). Electrons, passing through the channel portions, are injected from the emitter electrode 9b through the n$^+$-type emitter regions 4 and the channel portions into the n$^-$-type drift layer 1. By the region between the p-type collector layer 2 and n$^-$-type drift layer 1 of the IGBT 100 being forward biased by the injected electrons, holes are injected into the n$^-$-type drift layer 1 from the collector electrode 10, and conductivity modulation is generated, thus attaining a conduction state at a low on-voltage.

Next, in order to switch the IGBT 100 from the on state to the off state, by making the voltage between the emitter electrode 9b and the gate electrodes 7 equal to or lower than the threshold value, the electric charge accumulated in the gate electrodes 7 is discharged to the gate drive circuit via the gate resistor. At this time, the channel portions inverted to the n type return to a p type and vanish, thereby stopping the supply of electrons. By so doing, the injection of holes also stops, meaning that electrons and holes accumulated in the n$^-$-type drift layer 1 are emitted respectively to the collector electrode 10 and the emitter electrode 9b. Alternatively, by the electrons and holes recombining with each other, a current vanishes, and the IGBT attains the off state.

Figure 8B:
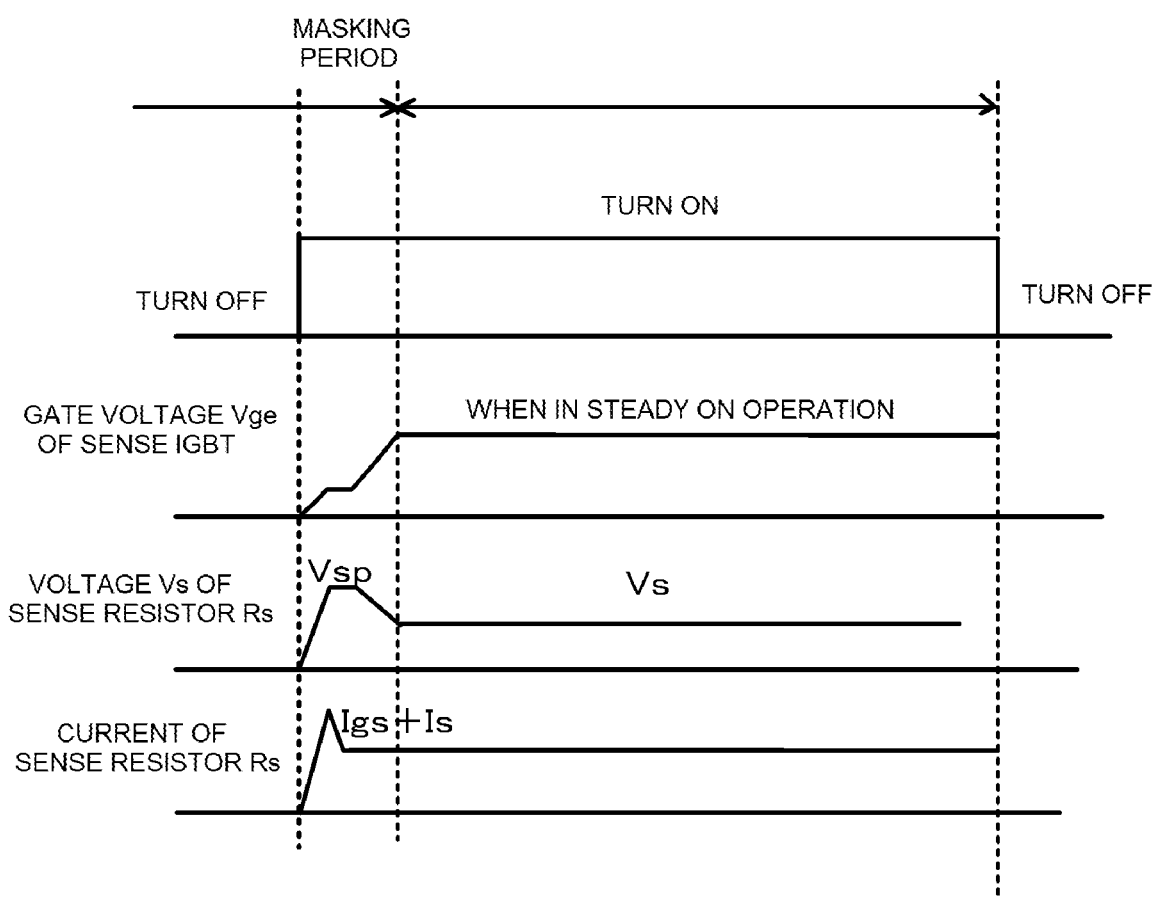

When turning on, the off-voltage between the collector and emitter electrodes drops. A depletion layer extending to the n$^-$-type drift layer 1 from the p-type channel regions 3a and the p-type channel regions 3a having no n$^+$-type emitter regions 4, of the sense IGBT, contracts as a result of the drop in the off-voltage. In this process, the depth of the irregularities of an equipotential surface 13 at the leading end of the depletion layer becomes smaller than the depth of the irregularities of the equipotential surface 11 (FIG. 5) of the main IGBT. As a result of this, the area of the equipotential surface 13 becomes smaller than that of the equipotential surface 11 (FIG. 5) of the main IGBT. Because of this, the gate-collector capacitance (Miller capacitance) of the sense IGBT decreases, and as shown in FIG. 8B, it is possible to make a time, in which the sense IGBT reaches a steady on operation, shorter than in the main IGBT. That is, it is possible to turn on the sense IGBT earlier than the main IGBT. As a result of this, it is possible to shorten a short circuit protection period (a masking period), as shown in FIG. 9B, and thus possible to reduce a short circuit capacity borne by the main IGBT. By so doing, it is possible to reduce the thickness of the semiconductor substrate, and thus possible to reduce the on-voltage by an amount equivalent to the thickness reduction.

Second Embodiment

Figure 11:
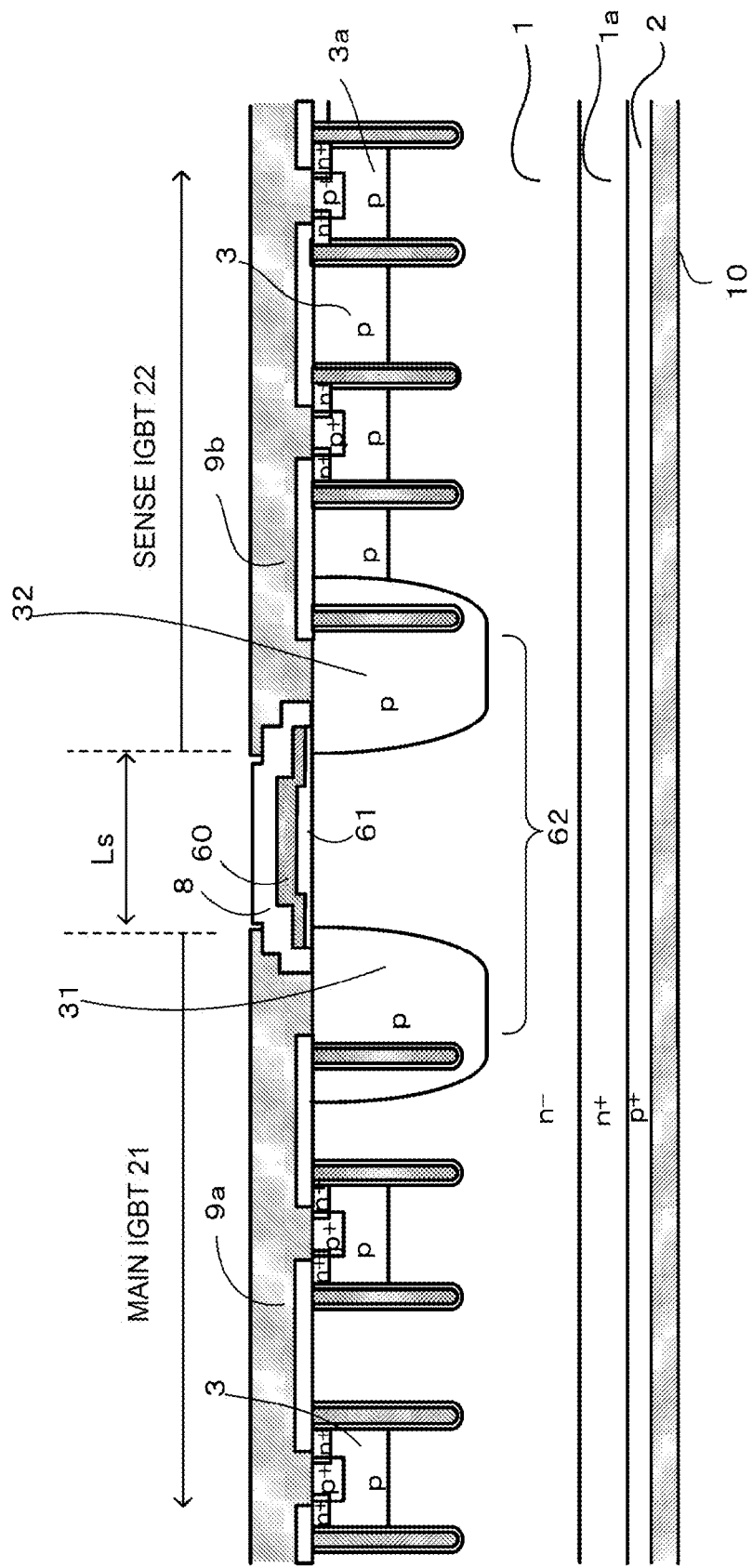
FIG. 11 is a partial enlarged sectional view showing a separation interval portion between a sense IGBT and main IGBT of a trench IGBT according to a second embodiment of the invention.

A description will be given, referring to FIG. 11, of a separating structure or space portion 62 of the main IGBT 21 and sense IGBT 22. Consideration will be given to a case in which the main IGBT 21 and the sense IGBT 22 are continuously formed without particularly providing the separating structure 62 (having a separation interval Ls). At this time, as the n$^-$-type drift layers 1 of the main IGBT 21 and sense IGBT 22 are electrically connected together via the internal resistors of the p-type channel regions 3a, it is unavoidable for a current to leak from one IGBT to the other. Meanwhile, consideration will be given to a case in which the sense IGBT 22 and the main IGBT 21 are spaced from each other, and the separation interval Ls is provided therebetween. At this time, the narrower the separation interval Ls is made, a current flowing through the sense IGBT shifts away from a current ratio corresponding to the area ratio of the sense IGBT to the main IGBT, meaning that current detection accuracy decreases. On the other hand, when the separation interval Ls is widened, the leakage decreases, and the detection accuracy increases, but the chip size increases, thus leading to an increase in cost. Also, the potential difference between the sense IGBT 22 and the main IGBT 21 is liable to occur when switching, and the sense IGBT 22 is liable to break down.

For the above reasons, the separating structure 62 is provided between the main IGBT 21 and the sense IGBT 22. Also, it is preferable to electrically separate the main IGBT 21 and the sense IGBT 22 without making the separation interval Ls of the separating structure 62 as wide as possible. In order to do so, the separating structure 62 is configured in the following way, as shown in FIG. 11. It is good that a p well region 32 connected to the emitter electrode 9b of the sense IGBT 22 is provided around the sense IGBT 22 so as to surround the sense IGBT region. Also, it is good that a p well region 31 connected to the emitter electrode 9a is provided around a side of the main IGBT 21 adjacent to the sense IGBT 22 so as to surround the p well region 32. Furthermore, the n⁻-type drift layer 1 is exposed to a front surface of the semiconductor substrate between the p well region 31 and the p well region 32. Further, this exposed surface is covered with a planar gate electrode 60 with an insulating film 61 (for example, a gate insulating film) sandwiched therebetween. Furthermore, the planar gate electrode 60 is covered with an interlayer insulating film 8.

By forming the p well regions 31 and 32, the following advantages are produced. In the neighborhood of the boundary between the main IGBT 21 and the sense IGBT 22, holes injected from the collector are trapped by the respective emitter electrodes 9a and 9b of the main IGBT 21 and sense IGBT 22 from the respective p well regions 31 and 32. By so doing, a current leaking from the main IGBT 21 to the sense IGBT 22 decreases, and the current detection accuracy increases. Also, the top of the separating structure 62 is covered with the planar gate electrode 60, and is electrically connected to the gate electrodes 7 of the trench gates. By so doing, as the potential of the front surface portion of the separating structure 62 approaches the potential of the gate electrodes rather than being completely floating, the potential of the front surface portion of the separating structure 62 is stable.

The separation interval Ls of the separating structure 62 is made the spaced distance between the p well regions 31 and 32. It is preferable that the separation interval Ls is in a range of, for example, 25 µm to 30 µm. When the separation interval Ls is shorter than 25 µm, during the short circuit protection, the depletion layer spreading between the p well region 31 and the p well region 32 is connected to both the p well region 31 and the p well region 32, thus generating a leak current, and a sense current ratio shifts away from a predetermined value. Also, when the separation interval Ls is longer than 30 µm, no leak current is generated, and the sense current ratio is stable, but the potential difference between the sense IGBT 22 and the main IGBT 21 is liable to occur, and the sense IGBT 22 whose area is small is liable to break down. From the above description, the IGBT 20 having the main IGBT 21 and sense IGBT 22 according to the invention is characterized by having the structure in which the feedback capacitance is reduced so that the sense IGBT 22 is turned on prior to the main IGBT 21 when the IGBT 20 is turned on. A specific structure thereof is such that the p-type channel region 3a is provided all over in the semiconductor substrate between adjacent parallel trenches 5, in the sense IGBT 22 alone, in order to reduce the area wherein the gate electrodes 7 are in contact with the semiconductor substrate via the gate insulating films 6. By adopting this kind of structure, it is possible to reduce the feedback capacitance of the sense IGBT 22 alone. However, as the IE effect also decreases, the on-voltage rises in the sense IGBT 22 alone, but as the active region area of the sense IGBT 22 is several hundred times to ten thousand times smaller than the active region area of the main IGBT 21, there is no substantial effect on the sense IGBT 22.

The IGBT according to the invention may have any other structure which is a structure in which the feedback capacitance of the sense IGBT is smaller than the feedback capacitance of the main IGBT. An example of the structure includes a structure in which the density of the unit cells of the sense IGBT is made higher than the density of the unit cells of the main IGBT.

As heretofore described, the trench MOS semiconductor device of the invention is such that as the short circuit protection period (masking period) is shortened, it is possible to reduce the short circuit capacity of the main IGBT and turn the amount of the reduction in the short circuit capacity into a reduction in the on-voltage. Consequently, it is possible to realize an IGBT whose loss is improved compared with heretofore known.

What is claimed is:

1. A trench MOS semiconductor device, comprising:
   a first conductivity type semiconductor substrate, the first conductivity type semiconductor substrate provided with at least a first surface side, and two semiconductor element portions including:
   a main semiconductor element portion formed on the semiconductor substrate; and
   a current detection sense semiconductor element portion, connected in parallel to the main semiconductor element portion, and having an area, in a plan view, smaller than an area of the main semiconductor element, each of the two semiconductor element portions including:
      second conductivity type channel regions formed on the first surface side of the first conductivity type semiconductor substrate and having front surface layers;
      first conductivity type emitter regions provided in the front surface layers of the second conductivity type channel regions;
      trenches, arranged in a parallel stripe pattern in plan view on the first surface side of the first conductivity type semiconductor substrate, the trenches having a depth greater than the second conductivity type channel regions, the trenches contacting the first conductivity type emitter regions;
      conductors filling the trenches via insulating films;
      interlayer insulating films covering the conductors; and
      a MOS gate structure including a main electrode in common contact with the front surfaces of the second conductivity type channel regions and the first conductivity type emitter regions,
   wherein the main semiconductor element portion includes a plurality of unit cells laid out in a checkered pattern in plan view such that in a longitudinal direction between adjacent trenches, adjacent unit cells are separated by the first conductivity-type semiconductor substrate, and such that in a width direction perpendicular to the longitudinal direction in the plan view, adjacent unit cells are separated by the first conductivity-type semiconductor substrate and by adjacent trenches sandwiching the first conductivity-type semiconductor substrate, and such that one unit cell is disposed diagonally to another adjacent unit cell, and wherein the current detection sense semiconductor element portion has a second conductivity type second channel region extending an entire width of the first surface of the semiconductor substrate between adjacent trenches, and extending an entire length of the first surface of the semiconductor substrate between adjacent unit cells in a longitudinal direction perpendicular to the width direction.

2. The trench MOS semiconductor device according to claim 1, a density of the unit cells of the sense semiconductor element portion is greater than a density of the unit cells of the main semiconductor element portion, such that a space between the unit cells of the sense semiconductor element is less than a space between the unit cells of the main semiconductor element.

3. The trench MOS semiconductor device according to claim 2, wherein an area ratio of the area, in the plan view, of the main semiconductor element portion to the area, in the plan view, of the sense semiconductor element portion is 100 to 10000:1.

4. The trench MOS semiconductor device according to claim 1, wherein an area ratio of the area, in the plan view, of the main semiconductor element portion to the area, in the plan view, of the sense semiconductor element portion is 100 to 10000:1.

5. The trench MOS semiconductor device according to claim 1, comprising:
a second conductivity type first well region connected to an emitter electrode of the main semiconductor element portion; and
a second conductivity type second well region connected to an emitter electrode of the sense semiconductor element portion, so that the second well region surrounds the sense semiconductor element portion region.

6. The trench MOS semiconductor device according to claim 1, further comprising:
a space portion provided so that the main semiconductor element portion and the sense semiconductor element portion are spaced from each other, wherein
the semiconductor substrate is exposed to a portion of the space portion on the first surface side of the semiconductor substrate.

7. The trench MOS semiconductor device according to claim 6, wherein the length of the spaced portion is equal to or more than 25 μm and equal to or less than 30 μm.

8. The trench MOS semiconductor device according to claim 1, wherein the trench MOS semiconductor device is a field effect transistor.

9. The trench MOS semiconductor device according to claim 1, wherein the trench MOS semiconductor device is an insulated gate bipolar transistor.

10. A trench MOS semiconductor device, comprising:
a semiconductor substrate, the semiconductor substrate provided with at least a first surface side and two semiconductor element portions including:
a main semiconductor element portion formed on the semiconductor substrate; and
a current detection sense semiconductor element portion, connected in parallel to the main semiconductor element portion, and having an area, in a plan view, smaller than an area of the main semiconductor element,
each of the two semiconductor element portions including:
channel regions formed on the semiconductor substrate;
emitter regions provided in the channel regions;
trenches, arranged in a parallel stripe pattern in plan view on the semiconductor substrate, which extend from the semiconductor substrate, the trenches having a depth greater than the channel regions, the trenches contacting the emitter regions;
conductors filling the trenches via insulating films;
interlayer insulating films covering the conductors; and
a MOS gate structure including a main electrode in common contact with the channel regions and the emitter regions,
wherein the main semiconductor element portion includes a plurality of unit cells laid out in a checkered pattern in plan view such that, in a longitudinal direction between adjacent trenches, adjacent unit cells are separated by the semiconductor substrate, and such that in a width direction perpendicular to the longitudinal direction in the plan view, adjacent unit cells are separated by the semiconductor substrate and by adjacent trenches sandwiching the semiconductor substrate, and such that one unit cell is disposed diagonally to another adjacent unit cell, and
wherein the current detection sense semiconductor element portion has a second channel region extending an entire width of the first surface of the semiconductor substrate between adjacent trenches, and extending an entire length of the first surface of the semiconductor substrate between adjacent unit cells in a longitudinal direction perpendicular to the width direction.

* * * * *